United States Patent [19]
Graf, III

[11] Patent Number: 5,923,195
[45] Date of Patent: *Jul. 13, 1999

[54] FAST CLOCK GENERATOR AND CLOCK SYNCHRONIZER FOR LOGIC DERIVED CLOCK SIGNALS WITH SYNCHRONOUS CLOCK SUSPENSION CAPABILITY FOR A PROGRAMMABLE DEVICE

[75] Inventor: W. Alfred Graf, III, Saratoga, Calif.

[73] Assignee: Cypress SemiConductor Corp., San Jose, Calif.

[*] Notice: This patent is subject to a terminal disclaimer.

[21] Appl. No.: 08/828,434

[22] Filed: Mar. 28, 1997

[51] Int. Cl.$^6$ .............................. H03K 17/22; H03L 7/00
[52] U.S. Cl. ........................... 327/144; 327/141; 327/162
[58] Field of Search ................................... 327/172, 173, 327/174, 141, 144, 145, 152, 153, 154, 161, 162, 163, 544

[56] References Cited

U.S. PATENT DOCUMENTS

| | | | |
|---|---|---|---|
| 4,973,860 | 11/1990 | Ludwig | 327/145 |
| 5,001,374 | 3/1991 | Chang | 327/141 |
| 5,418,407 | 5/1995 | Frenkil | 327/163 |
| 5,764,710 | 6/1998 | Cheng et al. | 327/154 |

*Primary Examiner*—Toan Tran
*Attorney, Agent, or Firm*—Blakely, Sokoloff, Taylory & Zafman LLP

[57] ABSTRACT

A programmable device includes a circuit for generating an asynchronous logic derived clock signal derived from one or more of a number of input signals. Circuits for synchronizing the asynchronous logic derived clock signal to a reference clock signal are coupled to the circuit for generating the asynchronous logic derived clock signal. The circuits for synchronizing generate a synchronized logic derived clock signal from the asynchronous clock signal and a reference clock signal. The programmable device further includes a circuit for suspending a clock signal. In one embodiment, a logic derived clock signal is generated and synchronized with a synchronous clock signal. In synchronizing the logic derived clock signal an intermediate signal is generated during a first clock cycle of the synchronous clock signal and is combined with the synchronized logic derived clock signal during a second clock cycle of the synchronous clock signal to produce a suspendable clock signal. The suspendable clock signal may be gated off in response to an input signal having a minimum duration of at least two clock cycles of the synchronous clock signal.

20 Claims, 9 Drawing Sheets

Synchronizer/Suspension Logic

FAST CLOCK GENERATOR AND CLOCK SYNCHRONIZER FOR LOGIC DERIVED CLOCK SIGNALS WITH SYNCHRONOUS CLOCK SUSPENSION CAPABILITY FOR A PROGRAMMABLE DEVICE

RELATED APPLICATIONS

This application is related to the following co-pending applications, each assigned to the Assignee of the present invention.

Application Ser. No. 08/827,271, filed Mar. 28, 1997, entitled, "Fast Clock Generator and Clock Synchronizer for Logic Derived Clock Signals with Synchronous Clock Suspension Capability for a Programmable Device".

Application Ser. No. 08/828,325, filed Mar. 28, 1997, entitled "Synchronizing Clock Pulse Generator for Logic Derived Clock Signals for a Programmable Device".

Application Ser. No. 08/825,359, filed Mar., entitled "Synchronizing Clock Pulse Generator for Logic Derived Clock Signals with Synchronous Clock Suspension Capability for a Programmable Device".

Application Ser. No. 08/825,484, filed Mar. 28, 1997, entitled "Pulse Discriminating Clock Synchronizer for Logic Derived Clock Signals for a Programmable Device".

Application Ser. No. 08/828,319, filed Mar. 28, 1997, entitled "Pulse Discriminating Clock Synchronizer for Logic Derived Clock Signals with Synchronous Clock Suspension Capability for a Programmable Device".

Application Ser. No. 08/825,482, filed Mar. 28, 1997, entitled "Asynchronous Pulse Discriminating Synchronizing Clock Pulse Generator for Logic Derived Clock Signals for a Programmable Device".

Application Ser. No. 08/825,489, filed Mar. 28, 1997, entitled "Asynchronous Pulse Discriminating Synchronizing Clock Pulse Generator for Logic Derived Clock Signals with Synchronous Clock Suspension Capability for a Programmable Device".

FIELD OF THE INVENTION

The present invention relates to programmable logic devices and, more particularly, to the generation and suspension of clock signals within a programmable device.

BACKGROUND

Programmable logic devices (PLDs) are popular general purpose logic devices. PLDs generally include an AND array, an OR array and an input/output (I/O) macrocell. A routing interconnect is used to transport signals to various elements within the device. The AND array typically includes a plurality of logical AND gates and generates a large number of output signals called AND or product terms. The AND terms are received by the OR array which generally includes a plurality of OR gates. The OR array generates a number of output signals, called sum terms, by ORing selected AND terms together. The sum terms generated by the OR array are then received by the I/O macrocell which comprises a number of circuit elements including D-type data registers. The I/O macrocell of most PLDs outputs signals from the PLD and also feeds output signals back into the AND array for further use.

Many families of programmable logic devices such as PLDs, complex PLDs (so-called CPLDs), field programmable gate arrays (FPGAs) and application specific integrated circuits (ASICs) are synchronously clocked devices. That is, these families of devices have dedicated pins which receive a system clock signal for use within the programmable logic device. For example, some conventional synchronous programmable logic devices receive clock input signals from dedicated clock/input pins and route such signals to programmable registers within one or more I/O macrocells.

Other families of PLDs can accommodate asynchronous clocking wherein the clock signals which are used to capture data in registers contained in these devices are created by logically combining a number of logic inputs and/or internally generated logic signals to create the clock signal. In these devices, a particular signal generated, for example, by the AND or OR arrays can be utilized, in place of a dedicated system clock, to capture a signal in one of the register elements in an I/O macrocell. This function is termed asynchronous clocking because a signal other than a dedicated system clock is utilized by one or more register elements. Where the asynchronous clock signal is generated by the AND array, the asynchronous clock signal may be referred to as a product term clock signal. Where the asynchronous clock signal is generated by the OR array, it may be referred to as a sum term clock signal or a sum of product terms clock signal if the asynchronous clock signal is generated by a combination of signals provided by the AND and OR arrays.

In architectures where an asynchronous signal is used by one or more register elements in an I/O macrocell as a clock signal, these logically derived clocks signals are restricted to very low frequencies of operation because the asynchronous signals usually must traverse the large general purpose logic array of the CPLD or FPGA. As a result, an input change in the incoming signal(s) from which the logic derived clock signal is created must wait for any proceeding transitions to transit the slow logic array signal path before the subsequent input transitions can be processed. This restriction limits the frequency at which these devices can operate to frequencies much lower than those possible for synchronous operation in which external clock signals are applied directly to a register clock input via fast, dedicated clock signal paths.

In addition, the input signals from which the logic derived clock signal is created can arrive at unpredictable times at the programmable device. The unpredictable signal arrival time may result in a violation in the setup or hold time relative to the data signal to be captured in the register. The difference between logic derived clock signal and data signal transit times through the programmable device can be considerable. Therefore, to ensure that this potential mismatch in signal timing does not cause a violation of the data signal setup time or hold time relative to the logic derived clock signal input to the register, operation must be derated to allow for the worst case difference or skew between the data signal and the logic derived clock signals which can be anticipated in a given CPLD or FPGA due to variations in internal logic placement and routing.

FIG. 1 shows an example of product terms used to create logic derived clock signals in macrocells of a CPLD which are part of a larger logic array of one of the logic blocks of a CPLD. CPLD 10 includes macrocells 12 and logic block logic array 14. Logic block logic array 14 receives a number of signals 16 from a programmable interconnect matrix (PIM) within CPLD 10. The PIM (not shown) acts as a user programmable routing matrix for signals within the device. Signals 16 from the PIM are passed to logic block logic array 14 for routing to one or more macrocells 12. Note that, in general, signals 16 from the PIM include the logic complement of each signal. Thus, for "n" signals, 2n signals lines are present in logic block logic array 14. Likewise, each of the logic gates 18 in logic block logic array will have 2n input lines. For clarity, however, only one input line for each logic gate 18 is shown and this shorthand form of notation is typically employed and understood by those skilled in the art and is used in this application to illustrate exemplary embodiments of the present invention.

One or more of the signals 16 provided to logic block logic array 14 may be combined using dedicated logic gates 19 to produce a product term clock signal 20. Product term clock signal 20 may be used as a logic derived clock signal by a register 22 within one of the macrocells 12. In general, register 22 captures data signal presented on line 29 in response to a rising (or falling) edge of a clock signal (CLK) on clock line 25. Using a multiplexer 24 within macrocell 12, a user can select between product term clock signal 20 or a synchronous clock signal 26 as the means by which data signals can be capture in register 22. Data signals which are captured in register 22 may ultimately be provided to an output pad 28 and/or routed back through logic block logic array 14 or the PIM to form more complex signal combinations.

The product term clock signal 20 shown in FIG. 1 may be responsive to one or more external input signals which can arrive at CPLD 10 at any time from an external system. There is significant risk that these external signals will produce changes at the clock signal input of register 22 which will violate required setup and hold times relative to the data signal supplied on line 29 for capture by register 22. Such an occurrence can cause the wrong data state to be captured by register 22. Also, when setup and hold times are violated there is significant probability that a metastable event can occur which will cause an undesired logic state to be output by register 22 until the metastable event has been resolved. Even though the correct output logic state may eventually be obtained, the time required for recovery from the metastable condition can be much longer than the usual clock input to valid data output delay. Normally, additional margins must be added to the logic derived clock signal period to allow for the resolution of such metastable states. This requirement adds even more delay to the logic derived clock period, lowering the frequency of operation even further.

Also as shown in FIG. 1, if a "sum" expression is required to generate the product term clock signal 20, it must be created in another macrocell 12 and fed back to the input of the clock product term 19. This added pass through logic block logic array 14 reduces even further the possible frequency of operation of the product term clock signal 20.

FIG. 2 shows the generation of logic derived clock signals in the logic cells of an FPGA by routing an output of one logic cell to the clock input of a register which receives data from an output of a subsequent logic cell. As illustrated, an input signal change which produces a change in the logic derived clock signal can be several logic blocks prior to the clock input of the controlled register.

FPGA 30 may include several logic cells 32a–32d. Logic cell 32a may receive and operate on one or more signals provided from a PIM 34. As illustrated, logic cell 32a receives three input signals 35. The circled interconnections of the inputs 35 within PIM 34 represent programmable elements (e.g., fuses, antifuses, flash cells, RAM cell controlled pass transistors, etc.) which have been programmed so as to route the respective signals to logic cell 32a.

Logic cell 32a may perform one or more operations on the input signals 35 and provide an output signal 36 to PIM 34. This output signal 38 may be one of several input signals 37 to logic cell 32b which performs other operations and produces output signal 38 to PIM 34. Finally, signal 38 may be one of several inputs 39 to logic cell 32c which performs further logical operations and provides data signal 40 to register 41.

Register 41 captures data signal 40 on the rising edge of a logic derived clock signal 42 which is itself received from PIM 34. Logic derived clock signal 42 is produced by logic cell 32d from a number of input signals 43. These input signals 43 may themselves be routed through PIM 34 prior to reaching logic cell 32d. If any of the input signals 43 which are used to create the logic derived clock signal 42 are derived from external asynchronous input signals whose transitions cannot be reliably predicted, no timing precautions will guarantee proper observance of relative data and clock signal timing requirements at the register 41 input.

It should be noted that the transit times for data signals and clock signals are strongly affected by the relative internal locations of the signal sources since FPGAs typically exhibit a wide distribution of internal interconnect delays. Consequently, the relative signal timing of the logic derived clock signal and the data signal is totally unpredictable and designs which rely on logic derived clock signals cannot be guaranteed to function reliably. As a result of this timing unpredictability, some FPGAs provide a clock enable which can be used to wait for all the transit delays to occur before enabling the clock signal path to the logic cell register. This approach still requires a delay to be observed to accommodate the worst case possible delay in the clock signal path and the data signal must be held at the data input of the register to allow for this worst case delayed clock enable. This scheme results in very slow performance with logic derived clock signals.

Any logic derived clock signal (e.g., product term clock signal 20 in FIG. 1 or signal 42 in FIG. 2) whose arrival at a controlled register (e.g., register 22 in FIG. 1 or register 41 in FIG. 2) can result in the violation of setup or hold timing relative to the data signal input (e.g., signal 29 in FIG. 1 or signal 40 in FIG. 2) can generate a metastable register state which will frequently require a time longer than a normal clock signal to valid data output delay time to resolve to a stable output state. In the event that the arrival of logic derived clock signal cannot be predicted, additional timing margins must be provided in the clock signal path to allow the for metastable recovery time to ensure an acceptably low level of probability of a functional failure due to a metastablity event.

Accordingly, what is desired is a means to provide fast logic generated clock signals for use in CPLDs, FPGAs and other programmable devices to allow higher performance, logic derived clock frequencies. It is also desirable to have a means for synchronizing the logic derived clock signals to the data so as to eliminate the risk of register data signal and clock signal timing mismatches and to reduce or eliminate the potential for metastability-induced functional failures.

In addition, it is also desirable to provide a means for "gating" or suspending the clock signal in the programmable device. In digital circuits, it is often advantageous to disable any circuitry that is not currently being used so that power is not dissipated unnecessarily. This is especially true in CMOS devices. As discussed above, it is common to employ registers for capturing data in programmable devices. These registers operate, i.e., dissipate power, in response to clock signals. Thus, it has been recognized that suspending a clock signal which is supplied to such a register would result in a power savings because the register would not operate while the clock signal remains "off".

Despite the recognition of the power savings which might be achieved by suspending a clock signal to a register or registers in a programmable device, digital circuit designers have been reluctant to attempt such a solution. These designers recognize that unless the gating of the clock signal can be accomplished in a reliable, predictable fashion, such action may result in partial clock pulses being passed to a register. This may cause spurious clocking of the register when no clocking is needed or, perhaps worse, when invalid data is present at the input to a register. Such situations can themselves lead to metastability events.

Thus, to avoid the above uncertainties, rather than truly suspending the clock signals in a programmable device, circuit designers and users typically provide extra control logic and feedback paths which allow the output of a register to feed back to the input of the register so that the output state is recaptured in the register on successive clock pulses. Such a feedback system is illustrated in FIG. 3. Register 44 receives a data signal 45 and captures the data on the rising edge of clock signal 46 to provide output signal 47. When the state of output signal 47 is to be held constant, rather than suspend clock signal 46, output signal 47 is fed back to the input of register 44 via mux 48 which operates in response to control signals provided by control logic 49. This action simulates the effect of suspending the clock signal because the state of output signal 47 is recaptured by register 44 on successive clock cycles, thus remaining constant. However, because the register 44 is clocked on each clock cycle, no power savings is achieved. Accordingly, what is needed is a means for reliably and predictably suspending a clock signal in a programmable device.

SUMMARY OF INVENTION

In one embodiment, the present invention provides a programmable device which includes means for generating an asynchronous logic derived clock signal from one or more input signals. Means for synchronizing the asynchronous logic derived clock signal to a reference clock signal are coupled to the means for generating the asynchronous logic derived clock signal. The means for synchronizing generate a synchronized logic derived clock signal from the asynchronous logic derived clock signal and the reference clock signal.

Further, the present invention provides means for suspending a clock signal within a programmable device. In one embodiment, a logic derived clock signal is generated and synchronized with a synchronous clock signal provided to a programmable device. In synchronizing the logic derived clock signal an intermediate signal is generated during a first clock cycle of the synchronous clock signal and is combined with the synchronized logic derived clock signal during a second clock cycle of the synchronous clock signal to block or gate the synchronous clock signal during a logic LOW time of the synchronous clock signal period, thus suspending the synchronous clock signal.

BRIEF DESCRIPTION OF THE DRAWINGS

The features and advantages of the present invention are illustrated by way of example in the accompanying drawings which are in no way intended to limit the scope of the present invention to the particular embodiments shown.

DETAILED DESCRIPTION

Described herein is a programmable device which includes a dedicated, fast asynchronous clock logic array (CLA) which can be responsive to a subset of external input signals (or to all external input signals, if desired) and which provides a logic derived clock signal path to a register. The present invention may thus increase the upper bound on the frequency of operation of logic derived clock signals. Also included in the present invention is an asynchronous clock synchronizer (ACS) which provides a means to synchronize asynchronous, logic derived clock signals to one or more external synchronous clock inputs to the device. The asynchronous, logic derived clock signal may be synchronized to a synchronous clock signal used to capture a data input in an input register. The outputs of the input register may be logically combined with other signals in the programmable device to produce a data signal input into an output register which is responsive to the synchronized logic derived clock signal. Further, the present invention includes clock suspension logic which provides a means for suspending a clock signal in the programmable device and thereby allows for achieving a power savings over programmable devices which avoid true clock suspension by recapturing signals in one or more registers on each clock cycle. Although described with reference to a CPLD architecture, those skilled in the art will recognize that the present invention is equally applicable for use in PLDs, FPGAs, ASICs or other programmable devices. Accordingly, the embodiments described below should be regarded as illustrative only.

Figure 3:
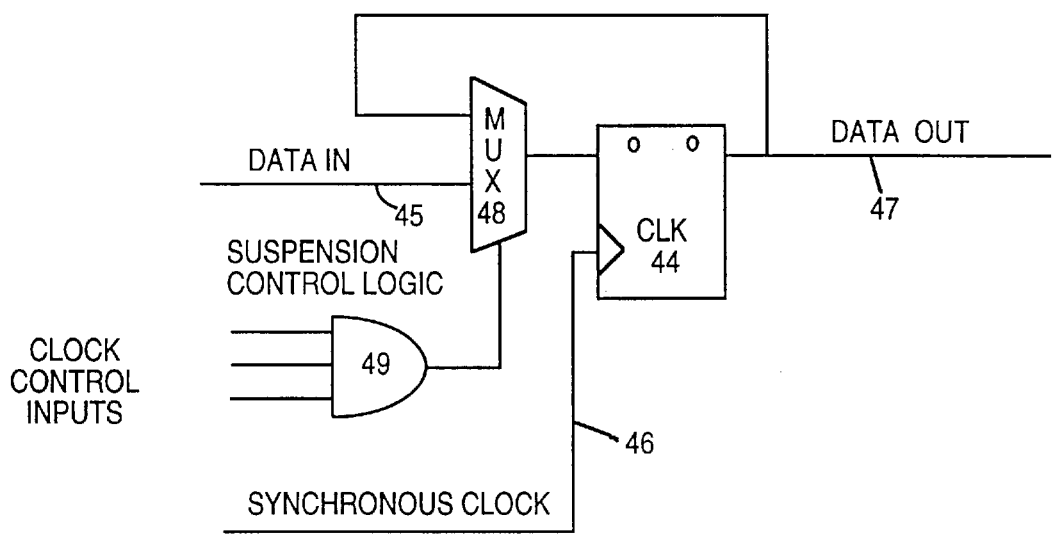
FIG. 3 illustrates a conventional means for suspending the action of a register clock by maintaining an output state of the register by feeding back an output of the register to an input of the register.
Figure 4:
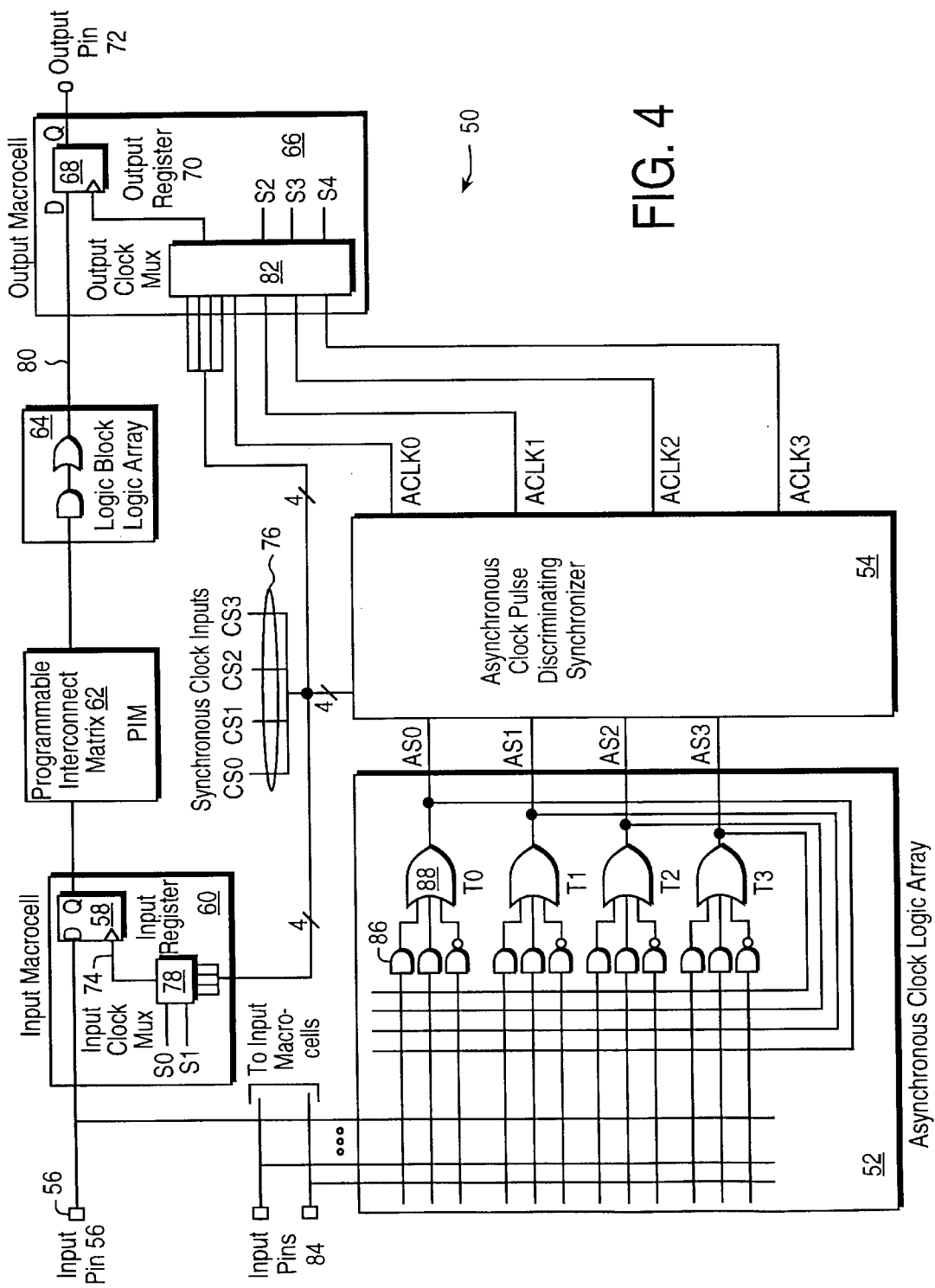
FIG. 4 illustrates a dedicated, asynchronous clock logic array and an associated asynchronous clock synchronizer with synchronous clock suspension logic according to one embodiment of the present invention.

FIG. 4 illustrates a programmable device 50 which includes an asynchronous clock logic array (CLA) 52 and an asynchronous clock synchronizer (ACS) with synchronous clock suspension logic 54. Data signals provided on an input pin 56 are captured in an input register 58 of an input macrocell 60. Output signals from the input register 58 are routed through a programmable interconnect matrix 62 to a logic block logic array 64 which may include logical AND terms and/or logical OR terms. The signals from register 58 are combined with other signals in device 50 in logic block logic array 64 to produce a resulting data signal on line 80 for presentation to output macrocell 66. The data signal so provided is captured in register 68, e.g., on the rising edge of a clock signal on output clock line 70, and passed to output pin 72. Alternatively, or in addition, the signal captured by register 68 may be routed back through PIM 62 and/or logic block logic array 64 to be combined with other signals to form more complex signals (these possible signal paths have not been shown in FIG. 4 so as not to overly complicate the drawing). It is important that the clock signal on output clock line 70 be provided to register 68 at a time when the data signal from logic block logic array 64 is valid. Otherwise, invalid data may be latched and/or a metastable condition may result The data signal on input pin 56 may be captured in register 58 on the rising edge of a clock signal provided on input clock line 74. This clock signal is typically an external synchronous clock signal and may be one of several such synchronous clock signals 76 provided to programmable device 50. For the embodiment illustrated in FIG. 3, four synchronous clock signals 76 (CS0–SC3) are provided to programmable device 50. In other embodiments, more or fewer synchronous clock signals 76 may be so provided. Input clock select multiplexer (mux) 78 controls which of the synchronous clock signals 76 are provided to register 58. As will be discussed in further detail below, the synchronous clock signal provided to register 58 on input clock line 74 will be delayed from the respective one of synchronous clock signals 76 by a time associated with a propagation delay through clock select mux 78.

Output register 68 captures a data signal on line 80 provided by logic block array 64. This data signal will be valid at a time dependent upon propagation delays associated with register 58, PIM 62 and logic block logic array 64. The data signal on line 80 may be captured in register 68 on the rising edge of an output clock signal on output clock line 70. The output clock signal may be one of the synchronous clock signals 76 or one of a number of synchronized logic derived clock signals ACLK0–ACLK3 provided to output clock select mux 82. Regardless of which signal is selected as the output clock signal, it is important that the output clock signal be provided to register 68 at a time when the data signal on line 80 is valid, otherwise invalid data will be captured or a metastable state may result.

Figure 1:
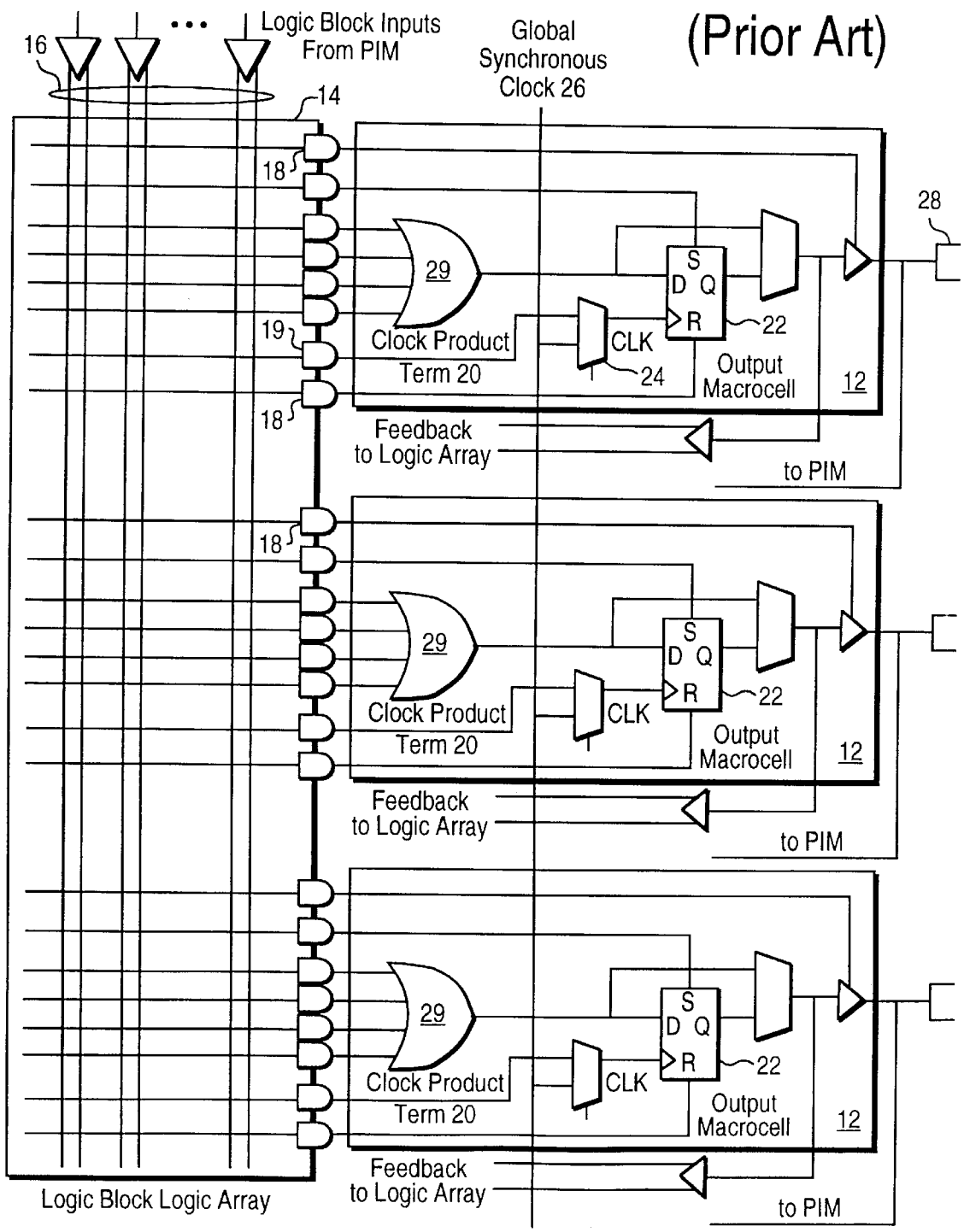
FIG. 1 illustrates the use of product term or asynchronous clock signals in macrocells of a conventional programmable device.
Figure 2:
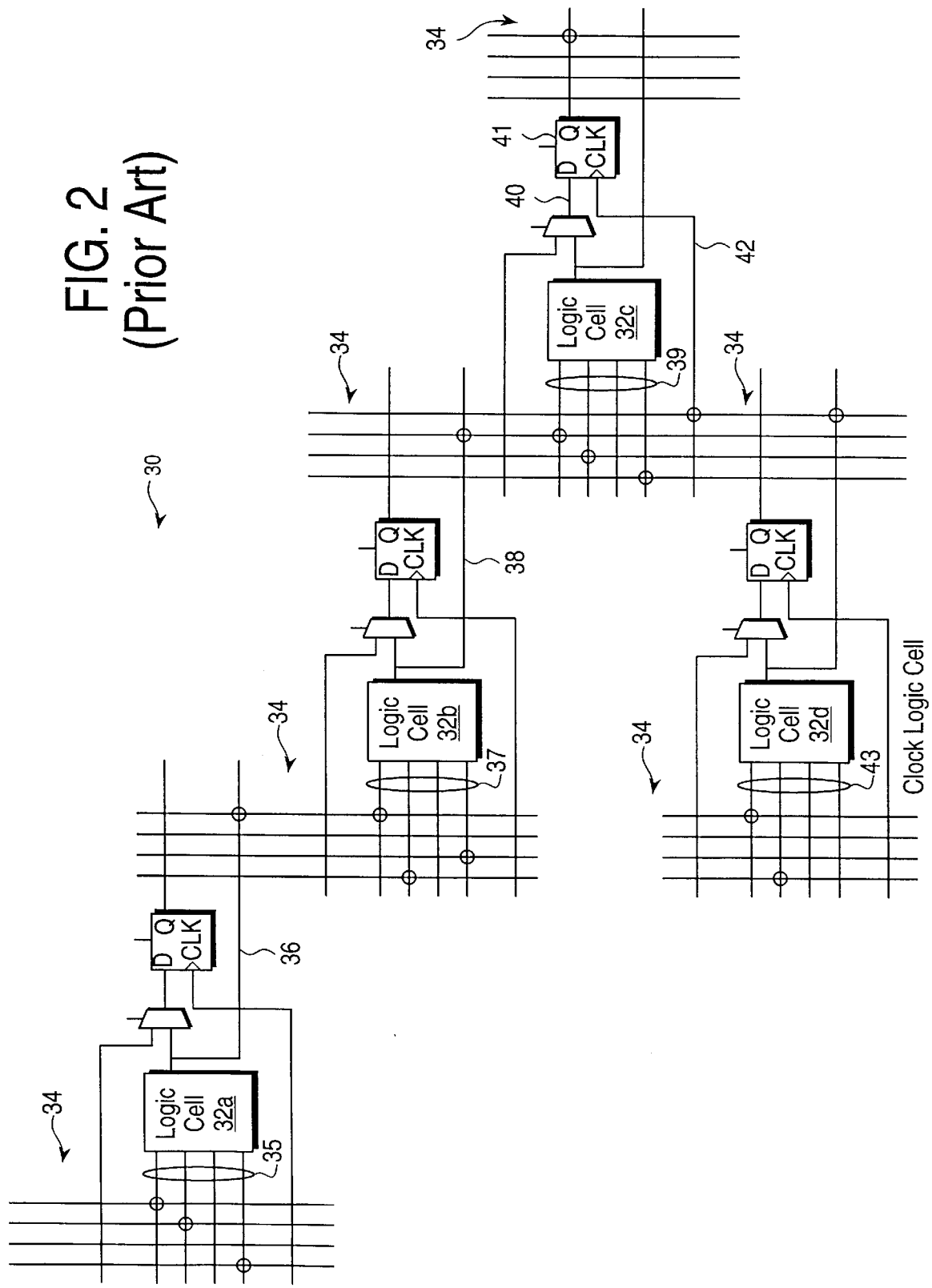
FIG. 2 illustrates the generation of logic derived clock signals in logic cells of a conventional FPGA.

Synchronized logic derived clock signals ACLK0–ACLK3 are produced by CLA 52 and ACS 54 in response to one or more input signals 84 and external synchronous clock signals 76. Input signals 84 may be one or more signals (e.g., data signals) provided to programmable device 50. These input signals 84 are provided directly to CLA 52 without being routed through PIM 62 or logic block logic array 64. Thus, propagation delays which were present in the logic derived clock signals discussed with reference to FIGS. 1 and 2 are avoided. This helps to increase the frequency at which registers such as register 68 which may capture data signals using logic derived clock signals may operate.

Asynchronous clock logic array (CLA) 52 is illustrated as including a number of logic gates 86 and 88. Logic gates 86 may have 2n inputs, where n indicates the number of input signals 84 provided to CLA 52. There are 2n inputs to logic gates 86 because each input signal 84 and/or its logic compliment may be logically combined in logic gates 86 to produce intermediate signals. These intermediate signals may be logically combined by one or more logic gates 88 to produce one or more asynchronous (product or sum term) logic derived clock signals. The same drawing shorthand used in FIG. 1 is used here.

Figure 5:
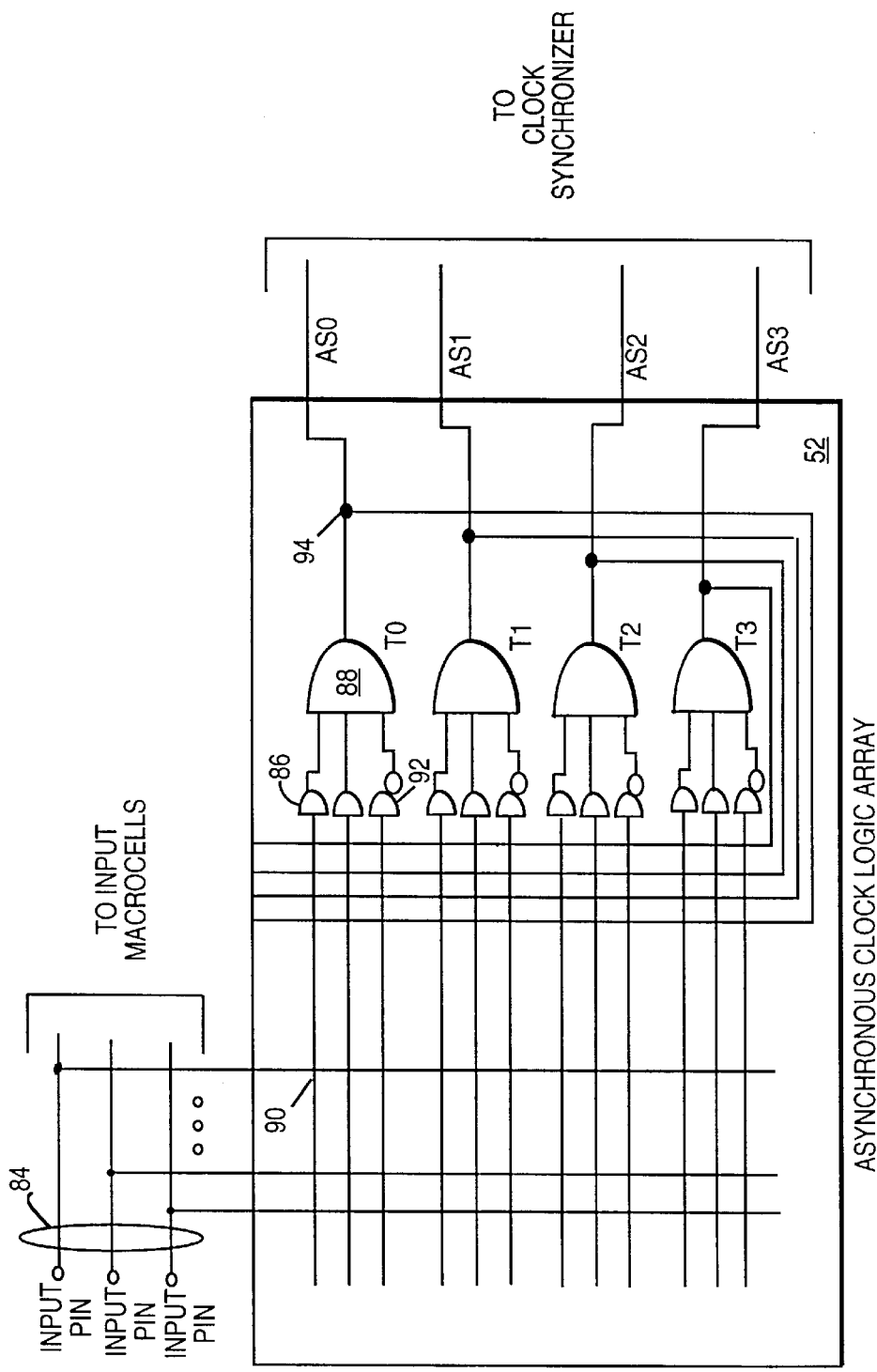
FIG. 5 illustrates one possible configuration of an asynchronous clock logic array for use according to one embodiment of the present invention.

FIG. 5 further illustrates CLA 52 in more detail. Again, the drawing shorthand discussed with reference to FIG. 1 is used here so as not to unnecessarily obscure the illustration. CLA 52 logically combines a subset (or all) of input signals 84 and/or their logic compliments using logic gates 86 and 88 to produce asynchronous logic derived clock signals AS0–AS3. Although CLA 52 is illustrated as being capable of providing four asynchronous logic derived clock signals, in other embodiments CLA 52 may be configured to provide fewer (e.g., 1–3, preferably 2–3) or more (e.g., $\geq 5$, preferably 5–64 or more preferably 2n, where $3 \leq n \leq 6$) asynchronous logic derived clock signals.

The number of input signals 84 which are combined to produce any of asynchronous logic derived clock signals AS0–AS3 is user selectable. The interconnection nodes, such as node 90, within CLA 52 are programmable, for example through the use of antifuses, fuses, flash cells, EPROM cells, RAM cells or other programmable elements. In this way, asynchronous logic derived clock signals AS0–AS3 produced by CLA 52 can be tailored to suit the required operation. CLA 52 may also provide a number of NAND terms 92. These NAND terms 92 allow for logical OR functions which those skilled in the art will recognize may be realized by DeMorganizing the logical complements of selected input signals 84. In this way, a "sum" term signal including two or more product terms may be provided without the need for a second pass through a logic array as was required for the apparatus illustrated in FIG. 1. Further, CLA 52 provides feedback paths, for example via node 94, which may allow product term (or sum of products term) signals to be combined with further sets or subsets of input signals 84 to produce even more logically complex asynchronous logic derived clock signals AS0–AS3.

Figure 6:
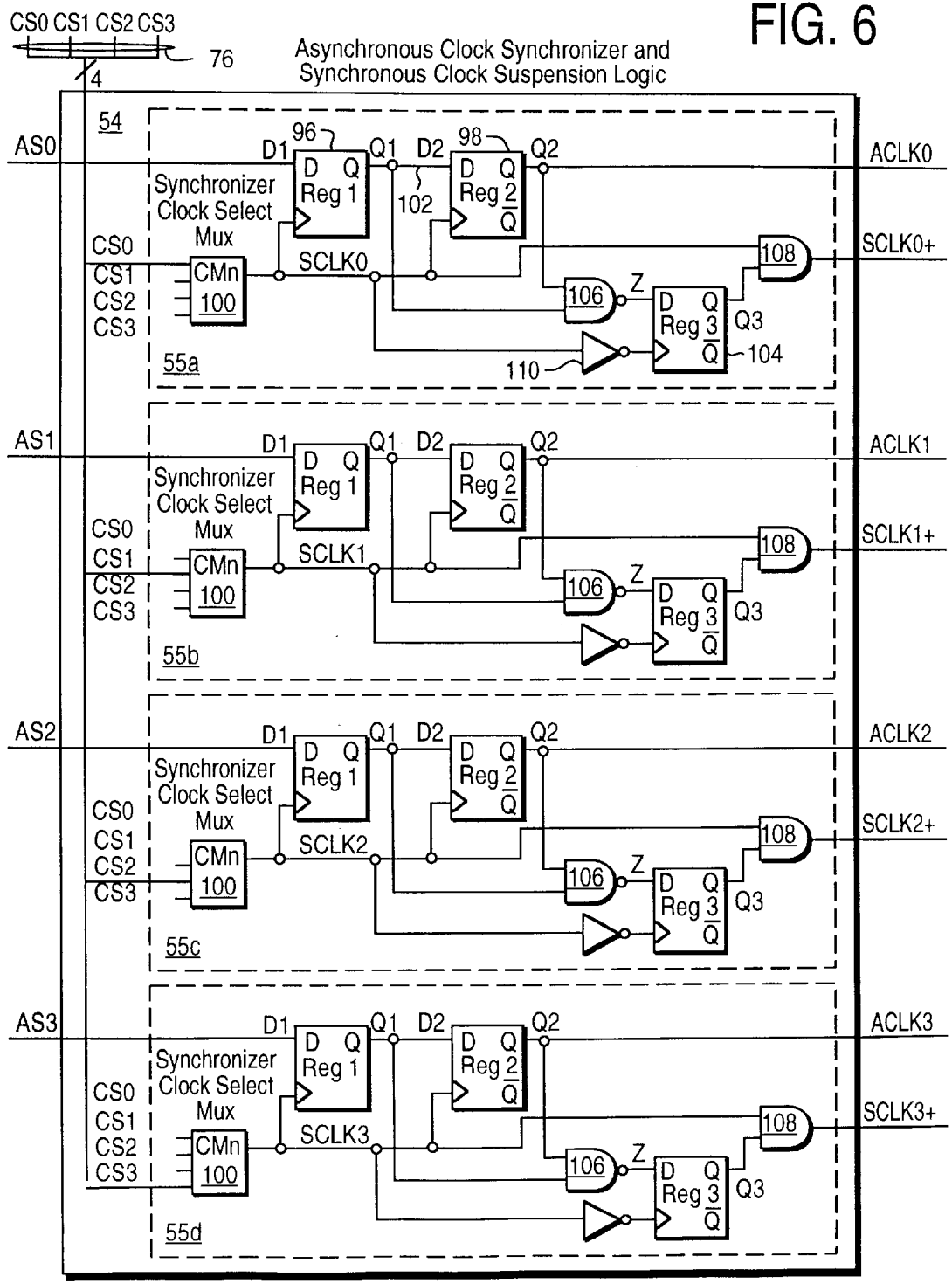
FIG. 6 illustrates one possible asynchronous clock synchronizer with synchronous clock suspension logic for use according to one embodiment of the present invention.

FIG. 6 further illustrates ACS 54. Asynchronous clock synchronizer (ACS) 54 receives as inputs, asynchronous logic derived clock signals AS0–AS3 and synchronizes one or more of these signals, each to a selected one of external synchronous clock signals 76 to produce synchronized logic derived clock signals ACLK0–ACLK3. Although illustrated as capable of accommodating four input asynchronous logic derived clock signals AS0–AS3, in other embodiments ASC 54 may accommodate more or fewer asynchronous logic derived clock inputs. Likewise, although the illustrated embodiment receives four external synchronous clock signals 76 (CS0–CS3), other embodiments may accommodate more or fewer such signals, depending upon the requirements of programmable device 50. Of course, ACS 54 may also be configured to provide fewer (e.g., 1–3, preferably 2–3) or more (e.g., $\geq 5$, preferably 5–64 or more preferably 2n, where $n \geq 3$ and preferably where $3 \leq n \geq 6$) synchronized logic derived clock signals than the illustrated ACLK0–ACLK3.

Asynchronous clock synchronizer 54 includes blocks 55a–55d, each of which includes synchronizing registers 96 and 98 and synchronous clock select multiplexers 100. For the illustrated embodiment, synchronizing registers 96 and 98 are D-type data registers, however, those skilled in the art will appreciate that other registers could be utilized with appropriate logic. In operation, an asynchronous logic derived clock signal, e.g., AS0, for block 55a, is provided from CLA 52 to the input of a first synchronizing register 96. This asynchronous logic derived clock signal is captured in register 96, e.g., on the rising edge of a synchronous clock signal SCLK0 (provided by clock select mux 100), to produce an intermediate signal on line 102. The intermediate signal is itself captured in register 98 on the next rising edge of SCLK0 to provide synchronized logic derived clock signal ACLK0. The other synchronized logic derived clock signals ACLK1–ACLK3 are similarly produced by synchronizing other asynchronous logic derived clock signals AS1–AS3, each to one of the synchronous clock signals (CS0–CS3) 76.

Multiplexers 100 provide a means for selecting one of synchronous clock signals CS0–CS3. An appropriate one of the synchronous clock signals 76 is selected using mux control signals to provide a delayed synchronous clock signal SCLK0–SCLK3. Note that because the propagation delay through multiplexer 100 is approximately the same as the propagation delay through input clock select mux 78 of input macrocell 60, the resulting delayed synchronous clock signal SCLK0–SCLK3 will be time shifted from a selected synchronous clock signal CS0–CS3 by approximately the same time as the clock signal presented to register 58 on input clock line 74. The external synchronous clock signal used to capture an input data signal in register 58 will typically be the same synchronous clock signal used by ACS 54 to synchronize one of the asynchronous logic derived clock signals AS0–AS3 and to provide one of the synchronized logic derived clock signals ACLK0–ACLK3 for use by register 68 in output macrocell 66.

In addition to providing synchronized logic derived clock signals ACLK0–ACLK3, ACS 54 produces gated (or suspended) clock signals SCLK0+–SCLK3+. Of course, in other embodiments ACS 54 may produce more or fewer gated clock signals. Gated clock signals SCLK0+–SCLK3+ are produced using registers 104 and logic gates 106 and 108 within each block 55a–55d of ACS 54. For example, gated clock signal SCLK0+ is produced from synchronous clock signal CS0 as follows.

Synchronous clock signal CS0 is selected by synchronous clock select mux 100 in block 55a to provide delayed synchronous clock signal SCLK0. Delayed synchronous clock signal SCLK0 is logically combined with output signal Q3 from register 104 to produce gated synchronous clock signal SCLK0+. Signal Q3 from register 104 is itself produced by logically combining the intermediate signal Q1 on line 102 with the synchronized logic derived clock signal ACLK0 in NAND gate 106. The resulting signal, Z, is captured by register 104 on a falling edge of SCLK0 (produced by inverting SCLK0 with inverter 110) to generate signal Q3. As will be discussed in greater detail below with reference to the timing diagram of FIG. 9, a single logic HIGH state of asynchronous logic derived clock signal AS0 is not sufficient to gate the synchronous clock signal SCLK0. Rather, two successive logic HIGH states (i.e., a logic HIGH which lasts at least as long as two cycles of synchronous clock signal CS0) of AS0 must be recognized before SCLK0 will be gated off by the synchronous clock suspension logic. Thus, spurious signals do not cause unwanted gating action and the gated clock signal SCLK0+ is reliable and predictable in nature.

Gated clock signals SCLK1+–SCLK3+ are produced in similar fashion in blocks 55b–55d, respectively. Each of the gated clock signals SCLK0+–SCLK3+ may be provided to output clock select mux 82 for routing to an appropriate output register (e.g., register 68) in programmable device 50.

Figure 7:
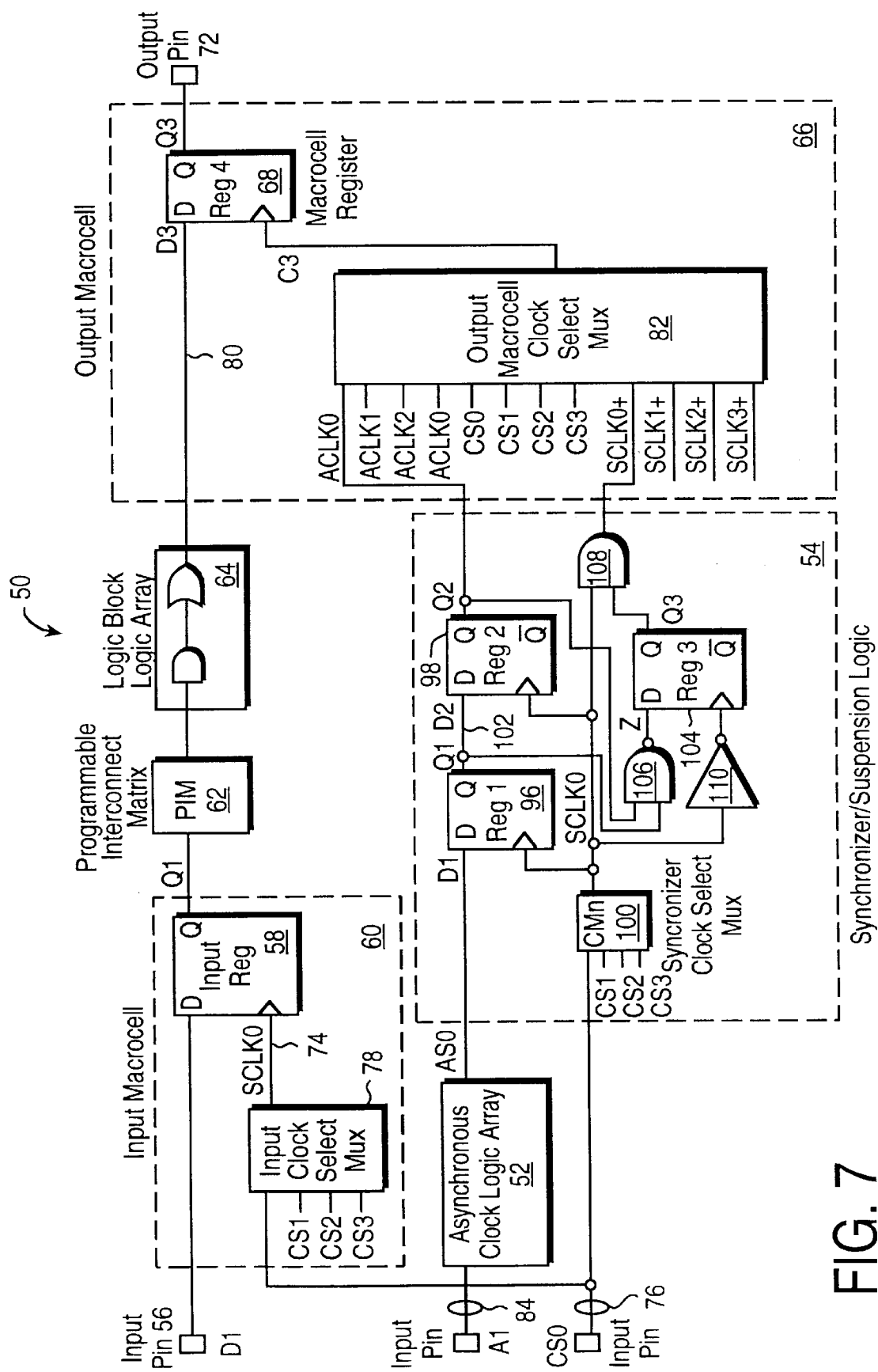
FIG. 7 illustrates signal paths for a data signal, a logic derived clock signal and a suspended clock signal to an output macrocell register in a programmable device according to a further embodiment of the present invention.

The operation of programmable device 50 is more fully described with reference to the signal path diagram of FIG. 7 and the timing diagram of FIG. 8. FIG. 7 shows the signal paths for a data input signal DI applied to input pin 56 to be captured in register 58 and subsequently in register 68 by a synchronized logic derived clock signal ACLK0 which is produced from an input logic signal AI. Although only single input signal AI is illustrated, it should be recognized that signal AI may be a combination of a number of input signals 84 as illustrated in FIGS. 4 and 5. The input signal DI is processed through programmable device 50 as described below to produce a data signal D3 line on 80 to be captured in output register 68 in output macrocell 66. Data signal D3 is captured in output register 68 on the rising edge of clock signal C3 so it is important that clock signal C3 be provided at a time when data signal D3 is valid. For the embodiment illustrated in FIG. 8, clock signal C3 is a delayed version of synchronized logic derived clock signal ACLK0. The manner in which this synchronization of signals is achieved in programmable device 50 is discussed with reference to the timing diagram of FIG. 8.

Figure 8:
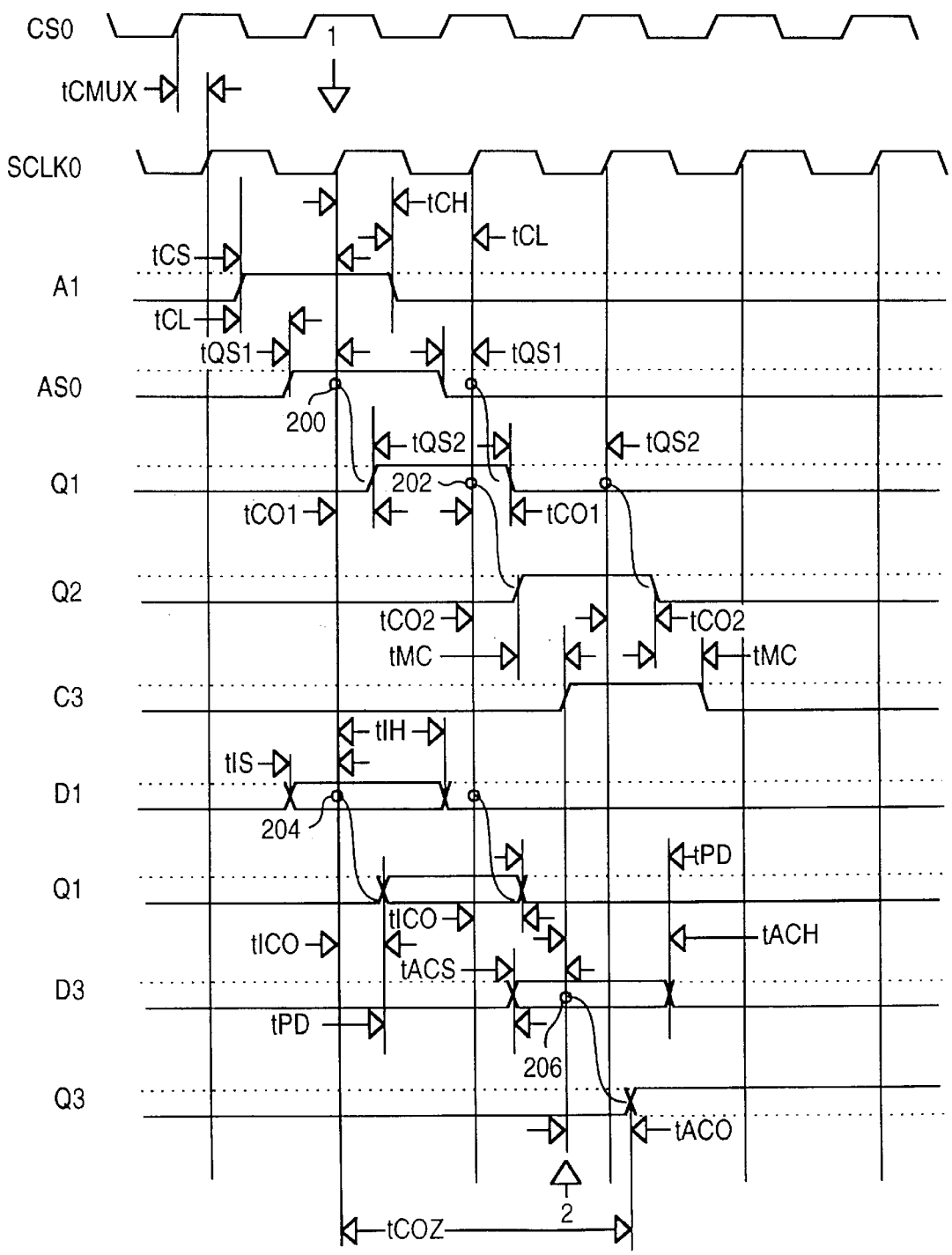
FIG. 8 is a timing diagram illustrating the operation of the asynchronous clock logic array and the clock synchronizer of the embodiment shown in FIG. 7.

FIG. 8 shows the timing for the synchronizing of a logic derived clock signal which ensures the reliable capture of data in output register 68 regardless of the time of arrival of the external signal changes AI which control the logic derived clock signal. As will become apparent, data may be captured in register 68 on alternate clock cycles of an external synchronous clock signal at the data input, DI, with a logic derived clock signal which is created via an external input signal transition on inputs AI of CLA 52. The frequency at which data can be processed by the logic derived clock signal C3 is one half the frequency of the external synchronous clock signal CS0. In FIGS. 7 and 8, it is assumed that synchronous clock signal CS0 is used to capture data signal DI in input register 58 and is therefore also used to synchronize the asynchronous logic derived clock AS0 for use by output register 68. For this reason, only one synchronous clock input signal CS0, and a single set of synchronizing registers 96 and 98 have been illustrated. However, it should be appreciated that this embodiment is merely one possible configuration of the programmable device 50 mere explicitly illustrated in FIGS. 4–6 and is provided for purposes of explanation and not limitation.

The generation of the synchronized logic derived clock signal ACLK0 will be discussed first. One or more logic input signals AI are provided to CLA 52 which produces asynchronous logic derived clock signal AS0 as described above with reference to FIGS. 4 and 5. As shown in FIG. 8, asynchronous logic derived clock signal AS0 is delayed from logic input signal(s) AI by a time $t_{CL}$, a maximum possible propagation delay associated with CLA 52.

Asynchronous logic derived clock signal AS0 is provided as input signal D1 to a first synchronizing register 96 in ACS 54. Synchronizing register 96 captures signal D1 on the rising edge of delayed synchronous clock signal SCLK0 which is provided by synchronous clock select mux 100. As shown in FIG. 8, SCLK0 is a synchronous clock signal time delayed from input synchronous clock signal CS0 by a time $t_{CMUX}$, a propagation delay associated with mux 100. Asynchronous logic derived clock signal AS0 is captured on a rising edge of SCLK0, transition point 200 in FIG. 7, to produce intermediate signal Q1 at the output of the first synchronizing register 96. Note that Q1 is delayed from transition point 200 (corresponding to the time of a rising edge of SCLK0) by a propagation delay $t_{CO1}$, the maximum possible delay associated with register 96.

Intermediate signal Q1 is provided as an input signal D2 to a second synchronizing register 98. Synchronizing register 98 captures intermediate signal Q1 on the next rising edge of SCLK0, transition point 202 in FIG. 8. This produces intermediate signal Q2, which is delayed by a propagation delay $t_{CO2}$ associated with register 98. Intermediate signal Q2 is the synchronized logic derived clock signal ACLK0 which is provided by ACS 54 to output clock select mux 82.

As illustrated in FIG. 8, output clock select mux 82 provides clock signal C3 which is delayed from synchronized logic derived clock signal ACLK0 by a time $t_{MC}$, the maximum possible propagation delay associated with mux 82. In this way, a synchronized logic derived clock signal is provided to output register 68 to allow capture of a data signal on line 80.

The manner in which the data signal on line 80 (i.e., data signal D3) is produced is as follows. Data input signal DI on input pin 56 is captured by register 58 on the rising edge of synchronous clock signal SCLK0 on input clock line 74. Notice that synchronous clock signal SCLK0 is the synchronous clock signal CS0 time delayed by a time $t_{CMUX}$, a propagation delay associated with input clock select mux 78. This is the same SCLK0 that was used to synchronize asynchronous logic derived clock signal AS0 as discussed above. Accordingly, input clock select mux 78 and synchronous clock select mux 100 are selected such that the two devices provide similar propagation delays. It will be recognized that this may be achieved in one embodiment by using a single synchronous clock select mux which provides a selected input synchronous clock signal SCLK0 to both input register 58 and ACS 54.

As shown in FIG. 8, data input signal DI is captured in input register 58 on the same rising edge of SCLK0 as asynchronous logic derived clock signal AS0 is clocked in register 96 (see transition point 204). This produces output signal Q1 at the output of register 58 after an associated propagation delay of time $t_{ICO}$ through register 58. Output signal Q1 is routed through PIM 62 and combined with other signals in device 50 in logic block logic array 64 to produce data signal D3, delayed by a time $t_{PD}$, the propagation delay associated with PIM 62 and logic block logic array 64.

Notice that the relative timings of the signals in programmable device 50 are such that data signal D3 is valid at a time 206 which corresponds to the rising edge of logic derived clock signal C3. As a result, valid data is captured in register 68 to produce output signal O3 after an associated propagation delay $t_{ACO}$.

For the clock synchronizing scheme to work reliably the upper bound on the frequency of the synchronous clock, SCLK0, to which the logic derived clock, AS0, can be synchronized should be consistent with the timing restrictions set forth below. The definitions of the timing parameters used in the equations for the timing restrictions are as follows:

$t_{PA}$=the minimum possible clock period at which data can be processed by the logic derived clock signal C3 which is synchronized to the external synchronous clock signal, SCLK0.

$t_{PS}$=the minimum clock period of synchronous clock waveform SCLK0 which still achieves synchronization of the asynchronous logic derived clock input, e.g., AS0, to synchronous clock signal SCLK0.

$t_{CL}$=the maximum possible propagation delay for an input signal on a clock logic array 52 input to propagate through the CLA 52.

$t_{QS1}$=the minimum required input data setup time relative to the clock input, SCLK0, to guarantee capture of valid data in register 96.

$t_{CO1}$=the maximum possible delay from synchronous clock input, SCLK0, to valid output Q1 for register 96.

$t_{QS2}$=the minimum required input data setup time relative to the synchronous clock input, SCLK0, to guarantee capture of valid data in register 98.

$t_{CO2}$=the maximum possible delay from synchronous clock input, SCLK0, to valid output Q2 for register 98.

$t_{MC}$=the maximum possible propagation delay for the synchronized logic derived clock signal ACLK0 to propagate through the output macrocell clock selection mux 82 to the clock input of the output register 68.

$t_{PD}$=the maximum possible propagation delay for the signal Q1 in FIG. 6 to propagate through the programmable interconnect matrix 62 and logic block logic array 64 to the data input of the output register 68.

$t_{CS}$=the minimum required logic signal (e.g., signal AI) setup time at the input of clock logic array (CLA) 52 relative to the synchronous clock signal input, SCLK0, for register 96 to guarantee transit of the CLA 52 and adequate time to meet setup time $t_{QS1}$ at the data input of register 96 to guarantee capture of the desired logic derived clock state in register 96.

$t_{CH}$=the minimum required logic signal (e.g., signal AI) hold time at the input of CLA 52 relative to the synchronous clock signal input, SCLK0, for register 96 considering transit of the CLA 52 and adequate to meet input data hold time at the data input of register 96 to guarantee capture of the desired logic derived clock state in register 96.

$t_{IS}$=the minimum required input data signal setup time relative to the synchronous clock input, SCLK0, to guarantee capture of valid data DI at the data input of the input register 58.

$t_{IH}$=the minimum required input data signal hold time relative to the synchronous clock input, SCLK0, to guarantee capture of valid data DI at the data input of the input register 58.

$t_{ICO}$=the maximum possible delay from synchronous clock input, SCLK0, to valid output Q1 for the input register 58.

$t_{ACS}$=the minimum required input data signal setup time relative to the synchronized logic derived clock signal input C3 at output register 68 to guarantee capture of valid data D3 at the data input of the output register 68.

$t_{ACH}$=the minimum required input data signal hold time relative to the synchronized logic derived clock signal input C3 at output register 68 to guarantee capture of valid data D3 at the data input of the output register 68.

$t_{ACO}$=the maximum possible delay from synchronized logic derived clock signal input C3 at output register 68 to valid output data O3 for the output register 68.

Timing constraints to guarantee synchronization of asynchronous logic derived clock signal AS0 with synchronous clock signal SCLK0 are determined in accordance with the following equations.

1. $t_{PS} > \text{or} = t_{CL} + t_{QS1}$
2. $t_{PS} > \text{or} = t_{CH} + t_{CL} + t_{QS1}$
3. $t_{PS} > \text{or} = t_{CO1} + t_{QS2}$
4. $t_{PS} > \text{or} = t_{IS} + t_{IH}$
5. $t_{PS} + t_{CO2} + t_{MC} > \text{or} = t_{ICO} + t_{PD} + t_{ACS}$
6. $t_{PA} > \text{or} = 2(t_{PS})$ The minimum possible clock period for synchronous clock signal SCLK0 is determined by the largest required $t_{PS}$ determined by constraints 1 through 5 above. The minimum period between data captures by the synchronized logic derived clock ACLK0 is determined by constraint 6 above.

For input data DI which is applied to input register 58 early enough to satisfy the $t_{IS}$ setup time relative to rising edge of synchronous clock signal SCLK0 at time 1 (transition point 200 in FIG. 8), the resultant data signal D3 will be captured in the output register 68 by the rising edge of synchronized logic derived clock signal C3 at time 2 (transition point 206 in FIG. 8) if the asynchronous logic derived clock signal source signal(s) AI has (have) been applied to the input of asynchronous clock logic array 52 a setup time $t_{CS}$ before the same rising edge of synchronous clock signal SCLK0 at time 1 (transition point 200 in FIG. 8). Setup time $t_{CS}$ for asynchronous input signal AI allows for CLA 52 transit time $t_{CL}$ and for register 96 setup time $t_{QS1}$, allowing the resulting asynchronous logic derived clock signal AS0 to be captured in the first synchronizing register 96. The subsequent synchronizing register 98, allows for metastability events which may result from violation of setup and hold times due to unpredictable arrival of the asynchronous clock logic array 52 input signal(s) AI. Data D3 to be captured in the output register 68 by the synchronized logic derived clock signal C3 can be captured in the input register 58 on every other rising edge of the of the synchronous clock signal SCLK0, providing an asynchronous data rate of one half the synchronous clock frequency $1/t_{PS}$ (maximum asynchronous data rate is $\frac{1}{2}t_{PS}$).

If one wishes to ensure capture of input data DI by asynchronous input signal AI, the input data DI can be held at the input for two consecutive synchronous clock rising edges (SCLK0) to insure against the asynchronous input signal (AI) failing to be captured on the first rising edge of SCLK0 at time 1 (transition point 200 in FIG. 8).

As discussed above, the power dissipation of a CMOS logic device is strongly dependent on the frequency at which the registers in the device are operated. Power supply current typically rises linearly with an increase in clock frequency and usually contributes a dominant portion of the power dissipation at even moderate operating frequencies. Thus, it is sometimes desirable to suspend the clock in these devices when the registers are not actually in use and thereby conserve power.

Figure 9:
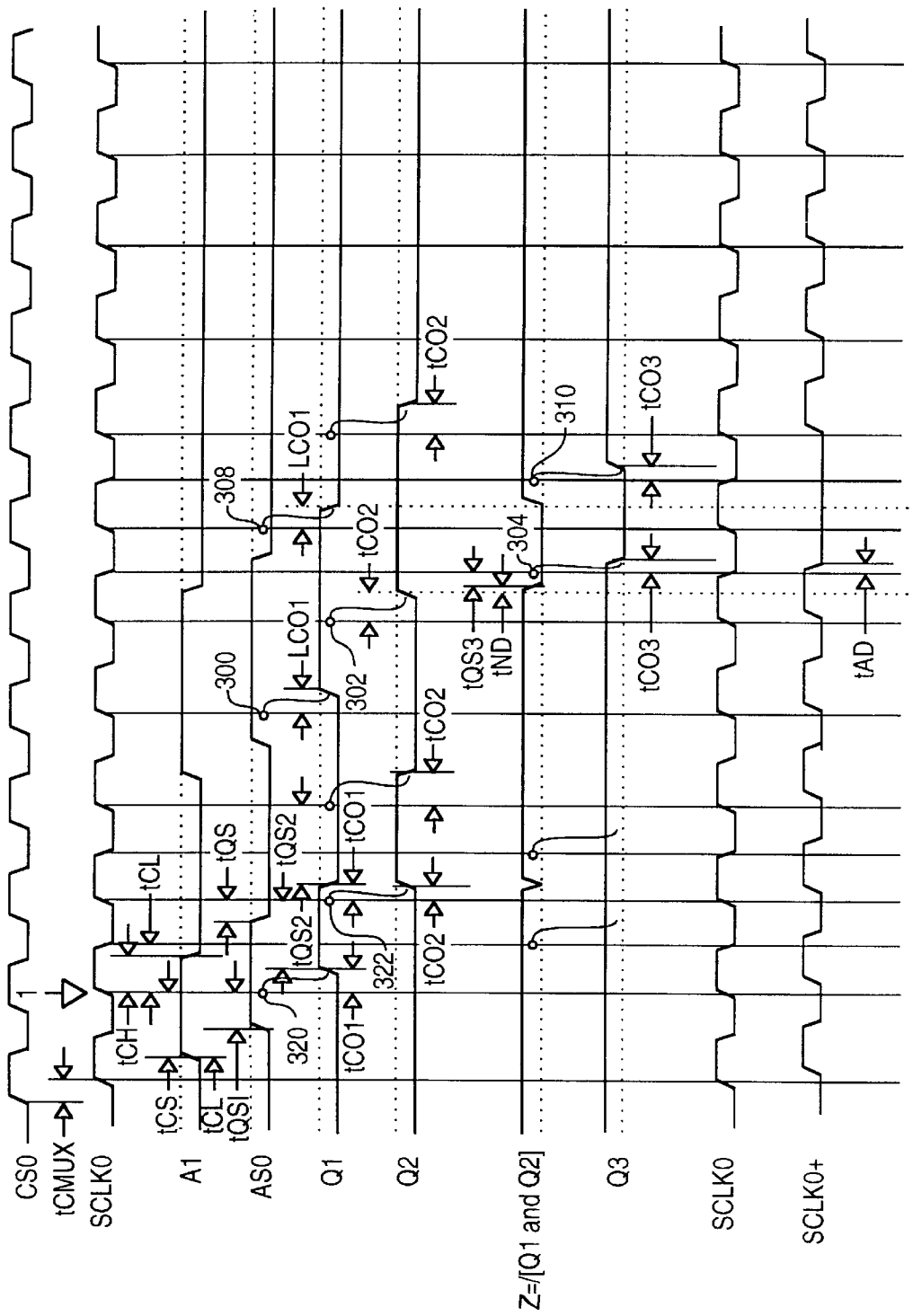
FIG. 9 is a timing diagram illustrating the operation of the synchronous clock suspension logic for the embodiment shown in FIG. 7.

Accordingly, FIGS. 7 and 9 illustrate a signal path and timing diagram, respectively, for a gated clock signal SCLK0+ in programmable device 50. Gated clock signal SCLK0 will be recognized as a signal which is derived from synchronous clock signal SCLK0 (i.e., CS0) which is used to capture input data signal DI in register 58 as described above. In brief, the signal path for SCLK0+ is configured so that synchronous clock signal SCLK0 is gated in a predictable manner by "closing" AND gate 108 during a first logic "LOW" period of a clock cycle of SCLK0 and then "opening" AND gate 108 during a subsequent logic LOW period of SCLK0, thereby allowing complete clock "HIGH" pulses to pass at clock suspend and clock restart times. The gated clock signal SCLK0+ may be provided to output clock select mux 82 for subsequent use by registers in programmable device 50. Although the embodiments illustrated in FIGS. 4–7 show up to four separate gated clock signals SCLK0+ –SCLK3+, it should be appreciated that in other embodiments, more or fewer gated clock signals could be provided for different numbers of external synchronous clock signals 76. Further, although asynchronous logic derived clock signal AS0 is illustrated as providing suspension control for gated clock signal SCLK0+ (and likewise for asynchronous logic derived clock signal AS1 and gated clock signal SCLK1+, etc.), it should be recognized that any of the asynchronous logic derived clock signals AS0–AS3 could be used for suspension control of any of the gated clock signals SCLK0+–SCLK3+.

As illustrated in FIGS. 7 and 9, asynchronous logic derived clock signal AS0 is produced by CLA 52 from input logic signal(s) AI in the manner discussed above. Asynchronous logic derived clock signal AS0 is delayed by propagation time $t_{CL}$ from input logic signal AI. Asynchronous logic derived clock signal AS0 is provided as input signal DI to synchronous register 96 and is captured in register 96 on a rising edge of SCLK0, transition point 300 in FIG. 9. This action results in the production of intermediate signal Q1 on line 102 after a time $t_{CO1}$, the propagation delay associated with register 96.

Intermediate signal Q1 is captured in register 98 on the next rising edge of SCLK0, transition point 302, to produce intermediate signal Q2 (i.e., synchronized logic derived clock signal ACLK0) after a propagation delay time $t_{CO2}$. Intermediate signals Q1 and Q2 are logically combined in NAND gate 106 to produce intermediate signal Z which is delayed from signal Q2 by a propagation delay $t_{ND}$.

Intermediate signal Z is captured in register 104 on a falling edge of SCLK0, transition point 304, following the rising edge which resulted in signal Q1 being captured by register 98. Notice that this falling edge is seen as a rising edge by register 104 due to the signal inverting action of inverter 110. As a result, output signal Q3 is produced by register 104 on the falling edge of SCLK0 (plus a propagation delay $t_{CO3}$). Output signal Q3 is logically combined with SCLK0 in AND gate 108 to produce gated clock signal SCLK0+. Note that SCLK0+ is skewed from SCLK0 by a delay time $t_{AD}$ associated with AND gate 108.

Gated clock signal SCLK0+ has the same frequency as synchronous clock signal SCLK0 (and, hence, synchronous clock signal CS0). By ensuring that logic input signal AI remains HIGH for two clock cycles of SCLK0, gated clock signal SCLK0+ will have one "high" pulse gated off. Successive logic HIGH states of AI will cause further high pulses of SCLK0+ to be gated off. Then, as illustrated in FIG. 9, when signal AI returns to a logic LOW state, asynchronous logic derived clock signal AS0 follows. This LOW state is recognized at transition point 306, corresponding to a rising edge of SCLK0, and is captured by register 96 accordingly. This results in intermediate signal Q1 falling to a logic LOW state after a propagation delay $t_{CO1}$.

The LOW state of signal Q1 is captured by register 98 on the next rising edge of SCLK0, transition point 308, and intermediate signal Q2 returns to a logic LOW state after a propagation delay $t_{CO2}$. Notice also that once intermediate signal Q1 falls to a logic LOW, intermediate signal Z returns to a logic HIGH. This logic HIGH is captured by register 104 on a falling edge of SCLK0, transition point 310, and, as a result, output signal Q3 returns to a logic HIGH. The logic HIGH state of signal Q3 combined with SCLK0 and AND gate 108 again allows the high clock pulses of SCLK0 to pass and clock signal SCLK0+ is no longer gated off. The logic HIGH state of signal Q3 occurs during "LOW" interval of SCLK0, ensuring that the gate (AND gate 108) is "open" for the leading edge of the next "high" interval of SCLK0 and that a complete "high" pulse is passed on resumption of gated clock signal SCLK0+.

In addition, notice in FIG. 9 that a single cycle logic HIGH state of input logic signal AI is not sufficient to gate off the clock signal SCLK0+. That is, when AI has a logic HIGH state for less than two clock cycles of SCLK0, no gating action results. For example, as shown at the left of the timing diagram, a logic HIGH pulse of AI with a duration of approximately one clock cycle of SCLK0 results in a similar pulse on asynchronous logic derived clock signal AS0. The logic HIGH state of AS0 is captured by register 96 on a rising edge of SCLK0, transition point 320, and a pulse, Q1, results. This pulse is captured by register 98 on the next rising edge of SCLK0, transition point 322, and a pulse, Q2, is produced. However, by the time pulse Q2 achieves a logic HIGH, due to the associated propagation delays and the short duration of the pulse AI, intermediate signal Q1 is already transitioning to a logic LOW state. Thus, intermediate signal Z is transitory and is not of sufficient duration to be captured in register 104. Output signal Q3 therefore remains HIGH and SCLK0+ remains ungated.

By rejecting spurious signals on AI, i.e., those signals of less than two clock cycles in duration, the clock suspension logic of ACS 54 ensures that only valid input signals (AI) result in a gated clock signal SCLK0+. Thus, the problems of prior art attempts to gate a clock signal are avoided.

Thus, input signal AI can be used to turn off and on the gated clock signal SCLK0+. To ensure reliable operation of the synchronous clock suspension logic, however, the following timing constraints (in addition to those above) should be observed.

$t_{PS} > \text{or} = t_{CL} + t_{QS1}$
$t_{PS} > \text{or} = t_{CH} + t_{CL} + t_{QS1}$
$t_{PS} > \text{or} = t_{CO1} + t_{QS2}$
$t_{PS} > \text{or} = t_{CMUX} + t_{AD} + t_{MC}$
$t_{WH} > \text{or} = t_{CO2} + t_{ND} + t_{QS3}$
$t_{WL} > \text{or} = t_{CO3}$ Where:

$T_{CMUX}$=the maximum signal propagation delay from the external synchronous clock input, CSx, to the output of the clock selection multiplexers 78 and 100.

$t_{AD}$=the maximum signal propagation delay from input to output for AND gate 108.

$t_{ND}$=the maximum signal propagation delay from input to output for NAND gate 106.

$t_{WH}$=the minimum allowed logic HIGH time of synchronous clock waveform SCLK0 which still achieves synchronization of the asynchronous logic derived clock input, AS0, to synchronous clock signal SCLK0.

$t_{WL}$=the minimum allowed logic LOW time of synchronous clock waveform signal SCLK0 which still achieves synchronization of the asynchronous logic derived clock input, e.g., AS0, to synchronous clock signal SCLK0.

$t_{QS3}$=the minimum required input data setup time relative to the clock input, SCLK0, to guarantee capture of valid data in register 104.

$t_{CO3}$=the maximum possible delay from clock input, SCLK0, to valid output Q3 for register 104.

Thus, a means for providing a fast logic generated clock signal for use in programmable devices to allow higher performance logic derived clocking frequencies and for synchronizing logic derived clock signals to a synchronous data clock to eliminate the risks of register data and clock timing mismatch has been described. Further, means for suspending a clock signal in a programmable device to allow for power savings have been described. Although discussed with reference to specific illustrated embodiments, it should be appreciated that the present invention is applicable to a variety of PLDs, CPLDs, ASICs and FPGAs. In addition, it should be recognized that the polarity of signal AI could be reversed (with the addition of suitable logic) so that the asynchronous logic derived clock signal would be responsive to a negative going pulse (i.e., a falling edge). Accordingly, the above described embodiments and accompanying diagrams should be regarded as illustrative only and the present invention should in no way be limited thereby.

I claim:

1. A method of suspending a clock signal in a programmable device comprising the steps of:

generating an asynchronous logic derived clock signal from one or more input signals;

synchronizing said asynchronous logic derived clock signal with a synchronous clock signal provided to said programmable logic device by:

producing a first intermediate signal from said asynchronous logic derived clock signal at a first clock cycle of said synchronous clock signal, producing a synchronized logic derived clock signal from said first intermediate signal at a second clock cycle of said synchronous clock signal;

combining said first intermediate signal with said synchronized logic derived clock signal during said second clock cycle of said synchronous clock signal to produce a second intermediate signal; and combining said second intermediate signal with said synchronous clock signal during said second clock cycle to produce a suspendable clock signal.

2. A method as in claim 1 wherein said step of combining said second intermediate signal with said synchronous clock signal comprises producing a signal which is the result of a logical AND operation between said second intermediate signal and said synchronous clock signal, said signal being said suspendable clock signal.

3. A method as in claim 2 wherein said suspended clock signal is gated off when said asynchronous logic derived clock signal is asserted for at least two clock cycles of said synchronous clock signal.

4. A method as in claim 3 wherein said first intermediate signal is produced using a first D-type data register which captures a logic state of said asynchronous logic derived clock signal in response to a first rising edge of said synchronous clock signal.

5. A method as in claim 4 wherein said synchronized logic derived clock signal is produced using a second D-type data register which captures a logic state of said first intermediate signal in response to a next rising edge of said synchronous clock signal.

6. A method as in claim 5 wherein said step of combining said first intermediate signal with said synchronized logic derived clock signal comprises using a third D-type data register to capture a logic state of a signal which is a logical NAND of said first intermediate signal and said synchronized logic derived clock signal.

7. A device, comprising:

means for generating an asynchronous logic derived clock signal from one or more of a plurality of input signals;

means for synchronizing said asynchronous logic derived clock signal to a reference clock signal to generate a synchronized logic derived clock signal coupled to said means for generating; and means for suspending said synchronized logic derived clock signal in response to said input signals.

8. A device as in claim 7 wherein said means for generating an asynchronous logic derived clock signal comprises an asynchronous clock logic array coupled to at least one of said plurality of input signals and adaptable to provide at least one of a sum of products term, a sum term or a product term combining any subset or all of said plurality of input signals to generate said asynchronous logic derived clock signal.

9. A device as in claim 8 wherein said means for synchronizing comprises a series coupled register pair configured to receive said asynchronous logic derived clock signal as an input and to generate said synchronized logic derived clock signal as an output in response to said reference clock signal.

10. A device as in claim 9 wherein said series coupled register pair comprises two D-type data registers.

11. A device as in claim 9 wherein said means for synchronizing further comprises a synchronous clock select multiplexer coupled to receive a plurality of external synchronous clock signals and to provide one of said plurality of synchronous clock signals as said reference clock signal to said series coupled register pair.

12. A method of generating a synchronized logic derived clock signal in a programmable device comprising the steps of:

generating an asynchronous logic derived clock signal from one or more of a plurality of input signals;

synchronizing said asynchronous logic derived clock signal to a reference clock signal to produce a synchronized logic derived clock signal; and suspending said synchronized logic derived clock signal in response to said input signals and said reference clock signal.

13. A method of generating a synchronized logic derived clock signal as in claim 12 wherein said step of synchronizing comprises the steps of:

capturing said asynchronous logic derived clock signal in a first register on a first clock cycle of said reference clock signal to produce an intermediate signal; and capturing said intermediate signal in a second register on a subsequent clock cycle of said reference clock cycle to produce said synchronized logic derived clock signal.

14. A method of generating a synchronized logic derived clock signal as in claim 13 wherein said reference clock signal has a minimum clock period of at least the sum of a first delay period associated with said step of generating said asynchronous logic derived clock signal and a second delay period required to ensure capture of a valid signal in said first register during said step of capturing said asynchronous clock signal.

15. A circuit, comprising:

an asynchronous clock logic array configured to generate an asynchronous logic derived clock signal from one or more input signals;

a clock synchronizer configured to synchronize said asynchronous logic derived clock signal to a reference clock signal to produce a synchronized logic derived clock signal; and a clock suspension circuit configured to receive said synchronized logic derived clock signal, said reference clock signal and an intermediate signal produced by said clock synchronizer in the process of producing said synchronized logic derived clock signal and to generate a suspended clock signal therefrom in response to an input signal having at least a minimum duration of two clock cycles of said reference clock signal.

16. A circuit as in claim 15 wherein said clock suspension circuit includes an AND gate, an output of which is said suspended clock signal.

17. A circuit of suspending a clock signal in a programmable device comprising:

means for generating an asynchronous logic derived clock signal from one or more input signals;

means for synchronizing said asynchronous logic derived clock signal with a synchronous clock signal provided to said programmable logic device by:

means for producing a first intermediate signal from said asynchronous logic derived clock signal at a first clock cycle of said synchronous clock signal, means for producing a synchronized logic derived clock signal from said first intermediate signal at a second clock cycle of said synchronous clock signal;

means for combining said first intermediate signal with said synchronized logic derived clock signal during said second clock cycle of said synchronous clock signal to produce a second intermediate signal; and means for combining said second intermediate signal with said synchronous clock signal during said second clock cycle to produce a suspendable clock signal.

18. A circuit as in claim 17 wherein said means for combining said second intermediate signal with said synchronous clock signal further comprises means for producing a signal which is the result of a logical AND operation between said second intermediate signal and said synchronous clock signal, said signal being said suspendable clock signal.

19. A circuit as in claim 18 wherein said suspended clock signal is gated off when said asynchronous logic derived clock signal is asserted for at least two clock cycles of said synchronous clock signal.

20. A circuit as in claim 19 wherein said first intermediate signal is produced using a first D-type data register which captures a logic state of said asynchronous logic derived clock signal in response to a first rising edge of said synchronous clock signal.

* * * * *